United States Patent
John et al.

(10) Patent No.: US 12,501,634 B2
(45) Date of Patent: Dec. 16, 2025

(54) METHOD FOR FORMING A TRANSISTOR WITH A CONDUCTIVITY DOPED BASE STRUCTURE

(71) Applicant: NXP USA, INC., Austin, TX (US)

(72) Inventors: Jay Paul John, Chandler, AZ (US); James Albert Kirchgessner, Tempe, AZ (US); Ljubo Radic, Gilbert, AZ (US); Johannes Josephus Theodorus Marinus Donkers, Valkenswaard (NL)

(73) Assignee: NXP USA, INC., Austin, TX (US)

( * ) Notice: Subject to any disclaimer, the term of this patent is extended or adjusted under 35 U.S.C. 154(b) by 616 days.

(21) Appl. No.: 17/929,877

(22) Filed: Sep. 6, 2022

(65) Prior Publication Data
US 2024/0079473 A1    Mar. 7, 2024

(51) Int. Cl.
H10D 10/01    (2025.01)

(52) U.S. Cl.
CPC .................. H10D 10/021 (2025.01)

(58) Field of Classification Search
CPC .. H10D 10/021; H10D 10/891; H10D 10/861; H10D 10/80; H10D 62/177; H10D 62/138; H10D 62/83; H10D 62/822; H10D 64/62
See application file for complete search history.

(56) References Cited

U.S. PATENT DOCUMENTS

| | | | |
|---|---|---|---|
| 7,037,798 B2 | 5/2006 | Adam et al. | |
| 8,686,424 B2 | 4/2014 | Gridelet et al. | |
| 8,871,599 B2 | 10/2014 | Donkers et al. | |
| 8,946,861 B2 | 2/2015 | Camillo-Castillo et al. | |
| 2019/0305119 A1* | 10/2019 | John | H10D 10/021 |
| 2021/0091183 A1* | 3/2021 | Holt | H10D 10/80 |

OTHER PUBLICATIONS

Hilson, G., "Lam Research Etch Tools Continue 3D Evolution", EE Times, Apr. 27, 2022.

* cited by examiner

*Primary Examiner* — William B Partridge
*Assistant Examiner* — Chevy J Boegel

(57) ABSTRACT

A method for forming a transistor with an emitter, intrinsic base, and collector. The base includes a semiconductor layer doped with a conductivity dopant to provide for a lower resistivity path to the intrinsic base. After the formation of a layer over a substrate, an emitter window opening is formed in the layer. The semiconductor layer is formed through the opening by a deposition process. A portion of the semiconductor layer is then removed. An emitter electrode is formed that includes at least a portion located in the opening. A remaining portion of the semiconductor layer is in a conductive path to the intrinsic base.

19 Claims, 16 Drawing Sheets

METHOD FOR FORMING A TRANSISTOR WITH A CONDUCTIVITY DOPED BASE STRUCTURE

BACKGROUND OF THE INVENTION

Field of the Invention

This invention relates in general to transistors with base structures.

Description of the Related Art

Some transistors such as bipolar transistors include a base as one of the transistor electrodes. Some types of bipolar transistors, such as heterojunction bipolar transistors (HBTs) can be used for high speed switching applications. HBTs typically implement different semiconductor material types for the emitter and base regions, creating a heterojunction. Some HBTs can handle signals of very high frequencies, up to several hundred GHz. HBTs can be used in radio-frequency (RF) systems and in applications requiring high power efficiency, such as in RF power amplifiers for cellular phones.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of at least one mode for carrying out the invention. The description is intended to be illustrative of the invention and should not be taken to be limiting.

Disclosed herein is a method for forming a transistor with an emitter, intrinsic base, and collector. The base includes a semiconductor layer doped with a conductivity dopant to provide for a lower resistivity path to the intrinsic base. After the formation of a layer over a substrate, an emitter window opening is formed in the layer. The semiconductor layer is formed through the opening by a deposition process. A portion of the semiconductor layer is then removed. An emitter electrode is formed that includes at least a portion located in the opening. A remaining portion of the semiconductor layer is in a conductive path to the intrinsic base.

In some embodiments, forming a semiconductor layer with conductivity dopants after forming an emitter opening and then removing a portion of the semiconductor layer may provide for a process where the conductivity dopants of the semiconductor layer do not diffuse into the intrinsic base during other high temperature processes used in making a transistor. In some embodiments, it may allow for the intrinsic base to be formed in a location where the semiconductor layer was removed. Furthermore, using a deposition process to form the semiconductor layer may allow for a more accurate placement of the material of the semiconductor layer such that the material does not move to undesirable locations.

Figure 1:
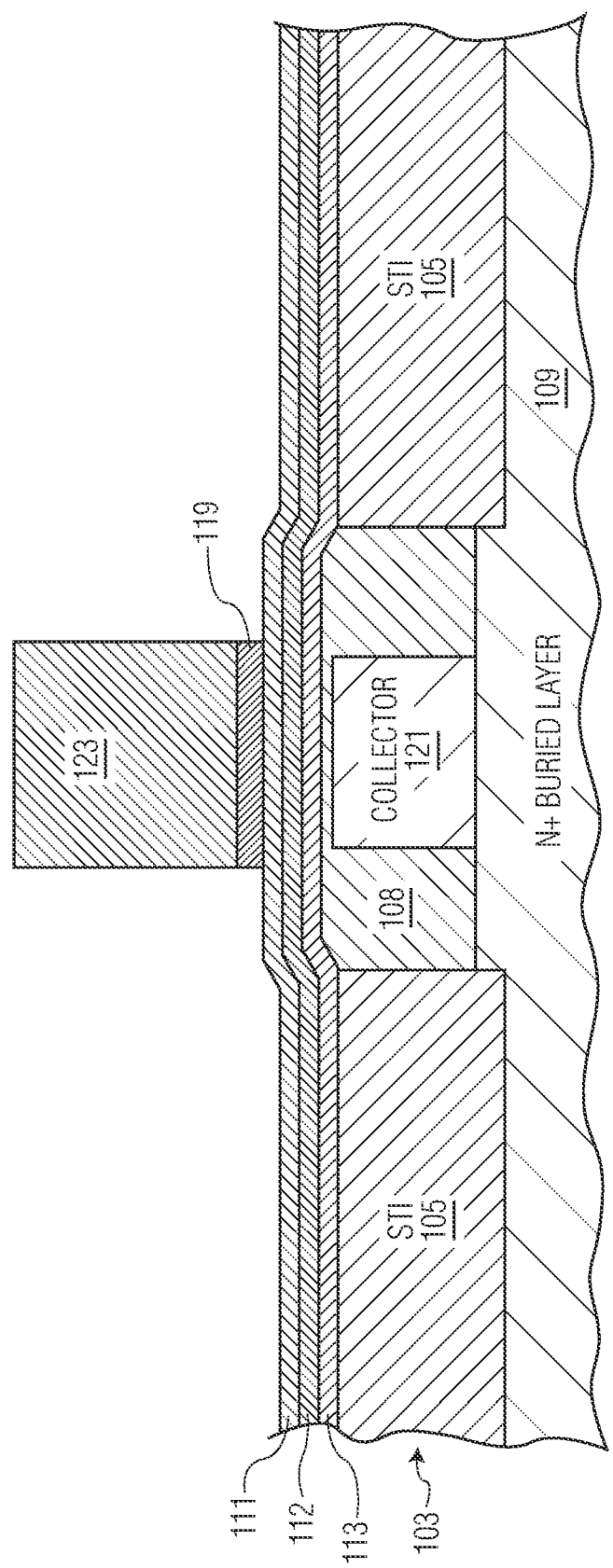
FIGS. 1-8 are partial cutaway side views of a wafer during various stages in the manufacture of a semiconductor device according to one embodiment of the present invention.

FIG. 1 is a partial cutaway side view of a wafer 101 according to one embodiment of the present invention. Wafer 101 includes a substrate 103 of monocrystalline silicon. A collector well 108 is located in substrate 103 laterally between portions of a shallow trench isolation structure (STI) 105. In one embodiment, STI 105 laterally surrounds well 108. In one embodiment, well 108 is doped with N-type conductivity dopants (e.g., arsenic, phosphorous) but may be doped with P-type conductivity dopants (Boron) in other embodiments.

In the embodiment shown, wafer 101 incudes a heavily doped N+ buried layer 109 below well 108. In the embodiment shown, a portion of layer 109 diffuses above the bottom of STI 105 in substrate 103. In other embodiments, layer 109 may be located deeper in substrate 103 and a portion of collector well 108 may also be present between layer 109 and the bottom of the STI 105. In one embodiment, layer 109 is doped with N-type conductivity dopants at a concentration of 1e20 per $cm^3$, but may be doped at other concentrations and/or be of other conductivity type dopants in other embodiments. In one embodiment, layer 109 is formed by a deep implant of N-type conductivity dopant ions. In other embodiments, layer 109 is formed by a surface ion implantation of dopants into a bulk wafer followed by an in-situ epitaxial deposition process on the bulk wafer. Afterwards, well 108 is formed by ion implantation into the substrate. Some embodiments include layer 109 but not well 108, while others may include well 108 but not layer 109. Some embodiments do not include a heavily doped buried layer.

FIG. 1 also shows wafer 101 after a selectively implanted collector region 121 is formed by an ion implantation of N-type dopants in well 108 prior to the formation of layers 113, 112, and 111. In one embodiment, region 121 is formed by the ion implantation of N-type conductivity dopants at a dosage in the range of 1e13-1e14 per $cm^3$ and at energies in the range of 100-500 keV, but may be formed with other dosages and at other energies in other embodiments. Region 121 serves as a collector region for a subsequently formed transistor. In other embodiments, collector region 121 may be formed during other subsequent stages of manufacture. In the embodiment shown, collector region 121 extends to buried layer 109. In other embodiments, region 121 does not extend to layer 109. Also in other embodiments, collector region 121 may be located closer to the top surface of well 108.

A semiconductor layer 113 is shown located on STI 105 and collector well 108. In one embodiment, layer 113 is made of silicon and serves a seed layer/buffer layer for the formation of a subsequent semiconductor layer 112. In one embodiment, after a cleaning operation with HF acid and a pre-bake in a hydrogen atmosphere, layer 113 is formed by a non selective epitaxial deposition process such that a portion of layer 113 formed over mono crystalline silicon well 108 has a monocrystalline structure with an initial lattice constant generally matching that of well 108. Portions of layer 113 formed over the oxide of STI 105 have a polycrystalline structure. In one embodiment, layer 113 is not doped with conductivity dopants when formed. In one embodiment, layer 113 has a thickness in the range of 8-20 nm, but may be of other thicknesses in other embodiments.

Semiconductor layer 112 is formed on layer 113. In one embodiment, layer 112 is formed by a non selective epitaxial deposition process of silicon germanium in-situ directly after layer 113 is grown. As a result of the epitaxial deposition process, a portion of layer 112 grown on a monocrystalline portion of layer 113 is monocrystalline with a lattice constant initially matching that of the top portion of the monocrystalline portion of layer 113. The portion of layer 112 grown on a polycrystalline portion of layer 113 is polycrystalline. In one embodiment, layer 112 is doped in-situ with P-type conductivity dopants (e.g., boron), but may be doped after deposition by an ion implantation process in other embodiments. In one embodiment, the doping concentration of P-type conductivity dopants of layer 112 is 1e20 per cm3, but may be of other concentrations in other embodiments. In one embodiment, layer 112 has a thickness in the range of 20-25 nm, but may be of other thicknesses in other embodiments. A portion of layer 112 will serve as the intrinsic base for a subsequently formed transistor.

A semiconductor capping layer 111 is formed over layer 112. In one embodiment, layer 111 is formed by a non selective epitaxial deposition process of silicon in-situ after directly after layer 112 is grown. As a result of the epitaxial deposition process, a portion of layer 111 formed on a monocrystalline portion of layer 112 is monocrystalline with a lattice constant initially matching that of the top monocrystalline portion of layer 112. The portion of layer 111 grown on a polycrystalline portion of layer 112 is also polycrystalline. In some embodiments, layer 111 is not doped with conductivity dopants when formed. In one embodiment, layer 111 has a thickness in the range of 10-20 nm, but may be of other thicknesses in other embodiments.

An oxide pad 119 is formed on selected portions of layer 111. In one embodiment, pad 119 is formed by depositing a blanket layer of oxide on wafer 101 and patterning the blanket layer with a photo resist mask 123. In one embodiment, the blanket layer of oxide is formed by a low pressure chemical vaper deposition (LPCVD) process or a plasma enhanced chemical vapor deposition (PECVD) process on wafer 101 where the formed layer has a thickness in a range 10-40 nm, but may have other thicknesses or be formed by other processes in other embodiments. After pattering the oxide layer, mask 123 is removed. In some embodiments, the oxide layer is not patterned.

In other embodiments, wafer 101 may have other configurations, include other layers, be made of other materials (e.g., other semiconductor materials such as gallium), and/or be formed by other methods.

Figure 2:
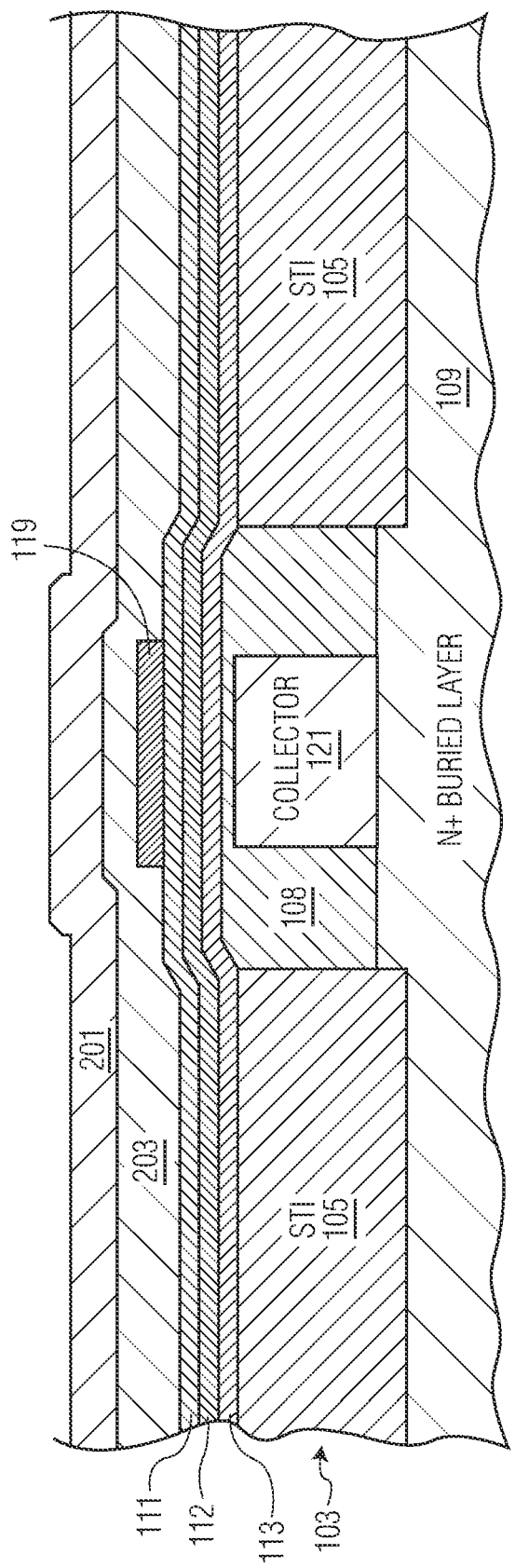

FIG. 2 is a partial cutaway side view of a wafer 101 after a blanket layer of poly silicon layer 203 is non selectively deposited on wafer 101. In one embodiment, layer 203 has a thickness in the range of 30 to 120 nm, but may have other thicknesses in other embodiments. In some embodiments, layer 203 is doped with a P-type conductivity dopant (either doped in in-situ or by ion implantation) at a concentration of 1e21 per cm3, but may be doped at other concentrations in other embodiments. In some embodiments, layer 203 will serve as a base electrode layer for providing a conductive path to an intrinsic base of a transistor.

A blanket layer 201 of nitride is formed on layer 203. in one embodiment, layer 201 has a thickness in the range of 30-100 nm, but may be of other thicknesses in other embodiments. In one embodiment, layer 201 is formed by a deposition process with some process temperatures being above 700 C.

Figure 3:
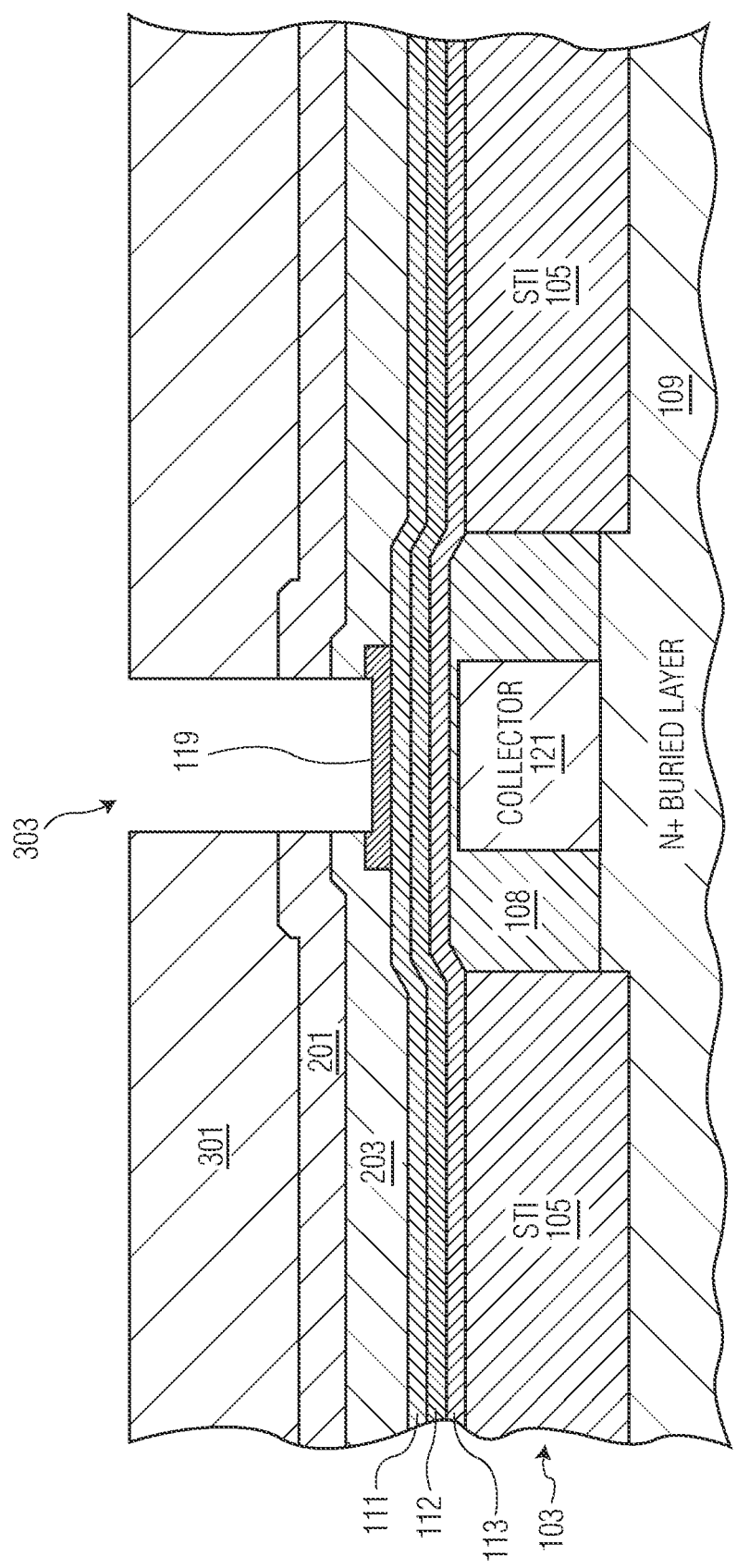

FIG. 3 is a partial cutaway side view of wafer 101 after an emitter widow opening 303 is formed in layers 201 and 203 to expose oxide pad 119. In one embodiment, opening 303 is formed by a reactive ion etch (RIE) through an opening in a patterned photoresist mask 301. However, opening 303 may be formed by other processes in other embodiments. In the embodiment shown, opening 303 is formed in an area of wafer 101 that is located between STI 105 portions shown in FIG. 3. In some embodiments, the etchant used in forming the opening in layer 203 may partially etch pad 119. Afterwards, mask 301 is removed.

Figure 4:
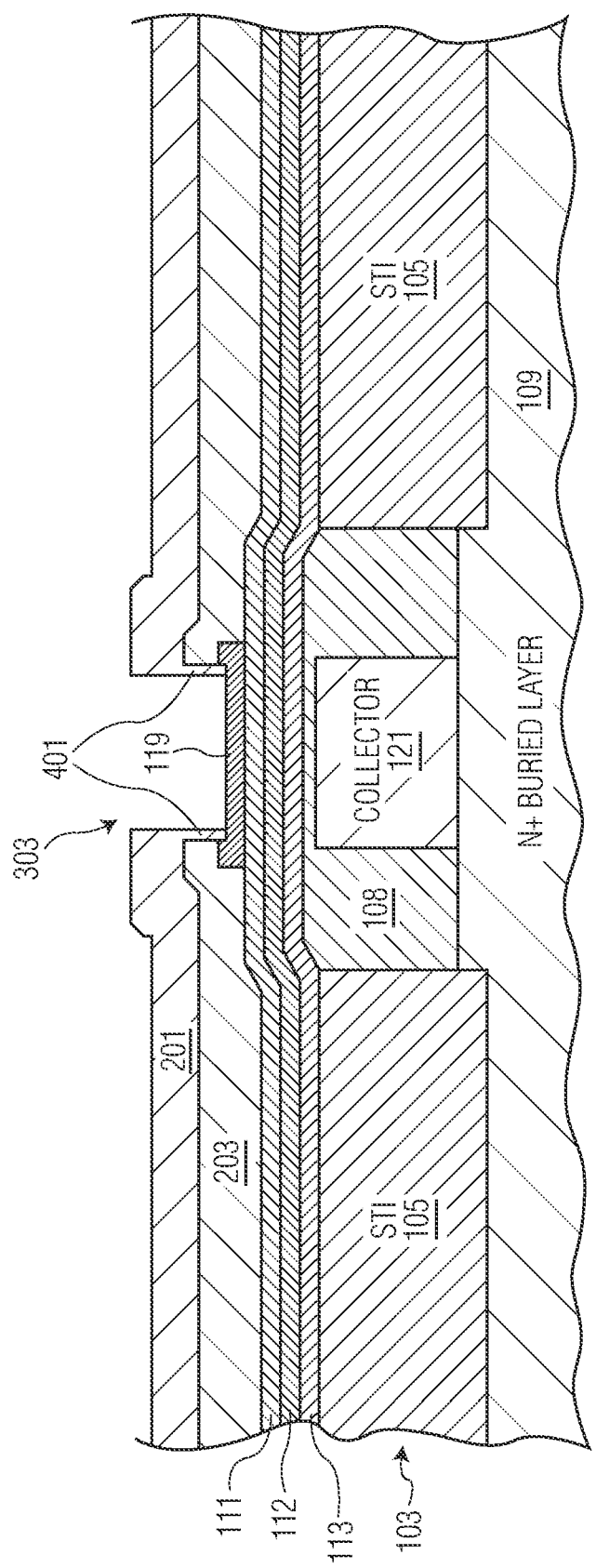

FIG. 4 is a partial cutaway side view of wafer 101 after the formation of nitride spacers 401 on the side walls of opening 303. In one embodiment, a relatively thin layer of nitride is deposited on wafer 101 followed by an anisotropic etch of the layer to remove the nitride formed on lateral surfaces, thereby leaving spacers 401. In some embodiments, the layer of nitride is deposited by a process that includes process temperatures exceeding 700 C. Spacers 401 protect the side walls of layer 203 during subsequent processing. In the cross-sectional view of FIG. 4, spacer 401 is shown as two separate portions. However, for the embodiment of FIG. 4, spacer 401 is contiguous around the entire perimeter of emitter window opening 303.

Figure 5:
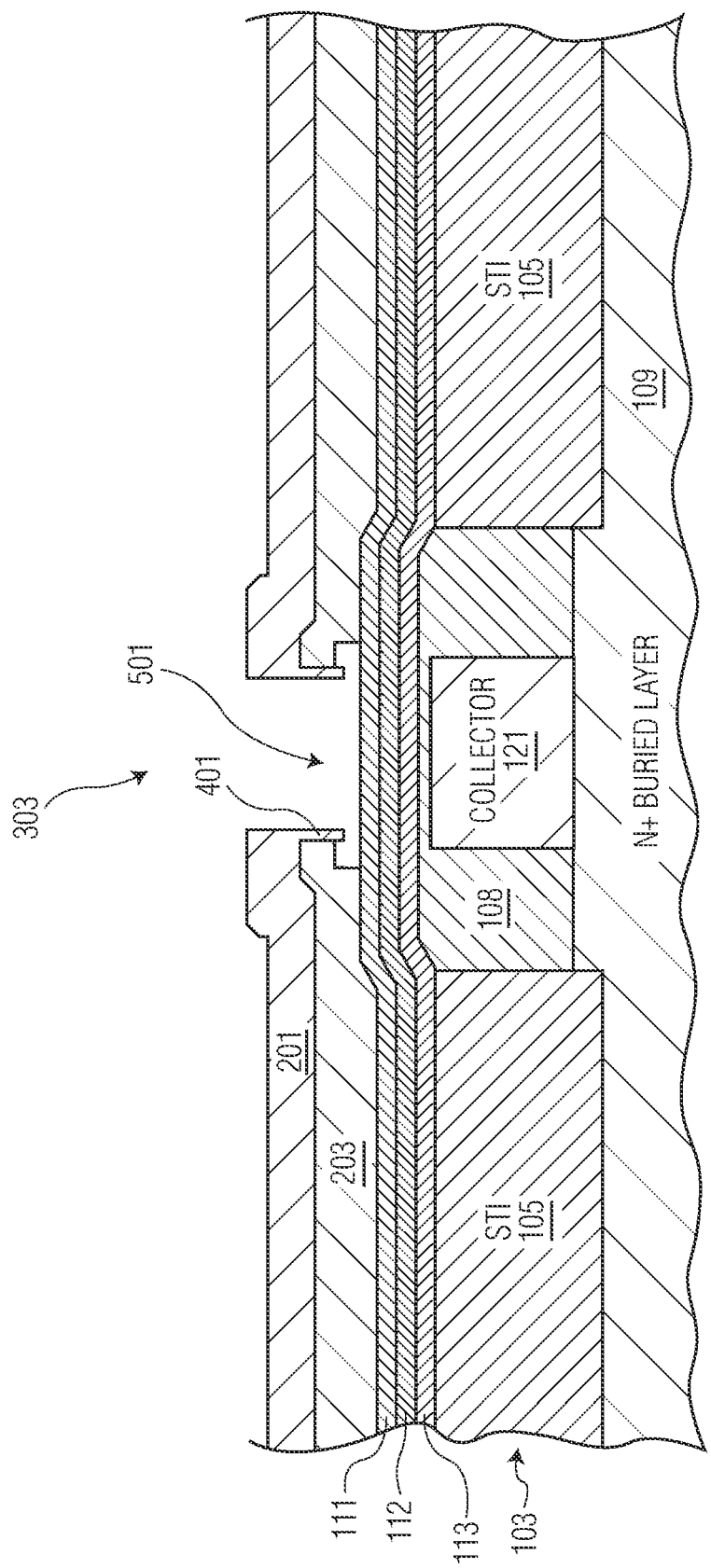

FIG. 5 is a partial cutaway side view of wafer 101 after pad 119 has been removed to form opening 501 which exposes the top surface of capping layer 111. The removal of pad 119 also exposes the underside of layer 203 adjacent to opening 303. In one embodiment, the oxide of pad 119 is removed with an isotropic etch having an etch chemistry that is selective to nitride and polysilicon such as hydrofluoric acid (HF). In embodiments where the oxide layer is not patterned to form pad 119, the isotropic etch may be a timed etch to where the layer is etched back to a desired position as shown in FIG. 5.

Figure 6:
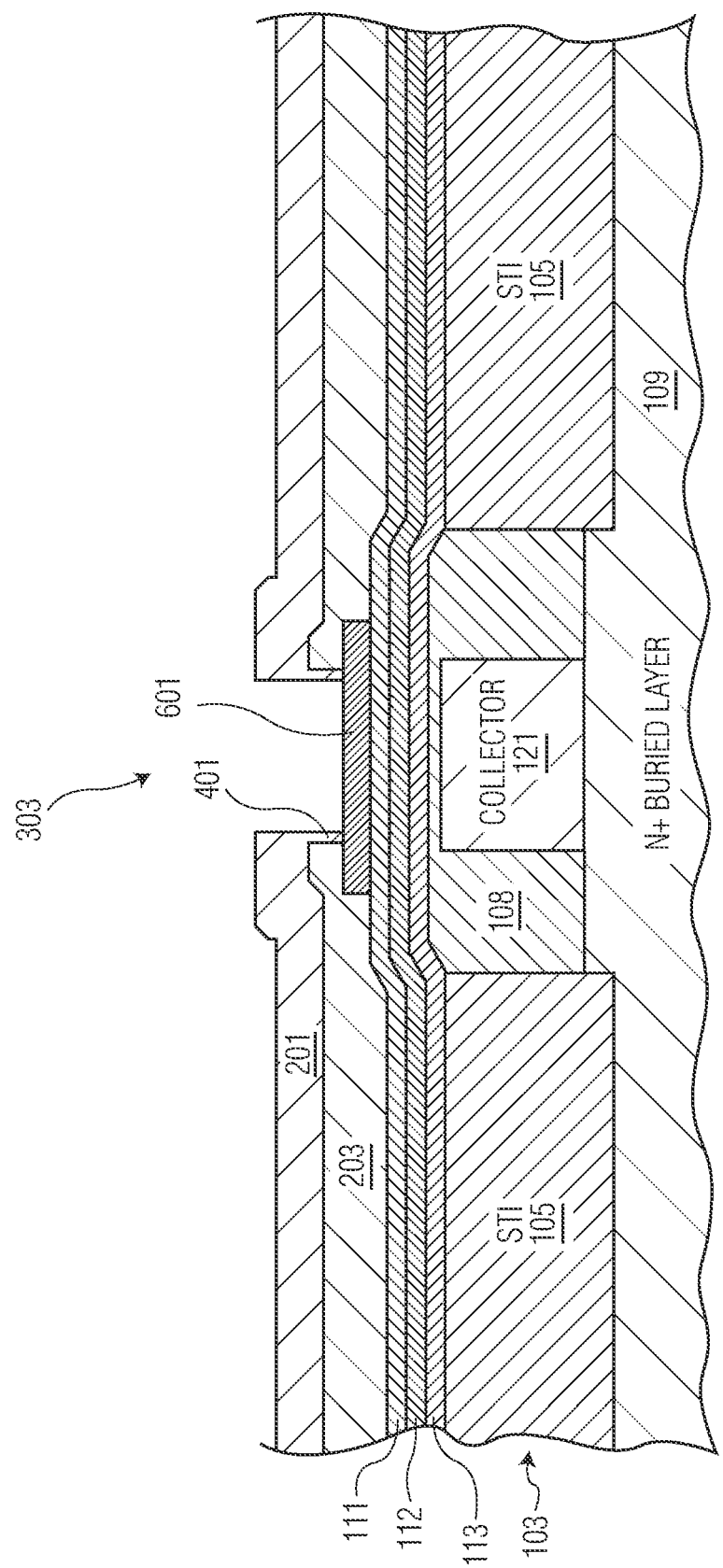

FIG. 6 is a partial cutaway side view of wafer 101 after a conductivity doped layer 601 of silicon germanium (SiGe) is formed in opening 501 on capping layer 111 and on exposed surfaces of layer 203. In one embodiment, layer 601 is formed by a selective epitaxial deposition process where P-type conductivity dopants (boron) are doped in-situ with the formation of the silicon germanium. A "deposition process" for forming material on a wafer is a process where the material formed on a wafer surface is from precursor material that originates external to the wafer. In one embodiment, wafer 101 is placed in a deposition chamber where a precursor of silane and germane gases are introduced in the chamber which enter opening 303, react with the exposed semiconductor surfaces of polysilicon layer 203 and capping layer 111 and deposit to form silicon germanium layer 601 that is in contact with both layer 203 and layer 111. Layer 601 is in-situ doped with boron using a diborane gas source introduced in the deposition chamber. Other precursor and source gases may be used in other embodiments.

Layer 601 is doped with P-type conductivity dopants (boron) at a concentration sufficient to provide a desired resistivity level to lower the resistance of a conductive path to an intrinsic base of a subsequently formed NPN transistor. In one embodiment, layer 601 has a boron doping concentration in the range of 1e21 per cm3, but may be of other concentrations in other embodiments. However, for PNP transistors, layer 601 may be doped with N-type conductivity dopants (phosphorous, arsenic). In some embodiments, the conductivity dopants may be implanted into layer 601 after layer deposition.

In some embodiments, forming a layer by a deposition process may advantageously provide for a more accurate formation of material of the layer at desired locations without disturbing previously formed structures (e.g., capping layer 111, SiGe layer 112, and layer 203). In processes where a structure is formed by a migration process where material of one part of the wafer migrates to another part of the wafer (e.g., in a hydrogen ambient at an elevated temperature), in some instances, accurate placement of dopants in the migrated material may not be achievable and other wafer structures may be significantly altered.

Furthermore, forming a doped semiconductor structure after the formation of the emitter window, may advantageously provide for a method that includes high temperature processes (e.g., the formation of nitride layer 201 and nitride spacer 401) being performed prior to the formation of the doped semiconductor structure where conductivity dopants from the structure (e.g., layer 601) do not significantly migrate to other areas of wafer 101 as a result of the high temperature processes.

Figure 7:
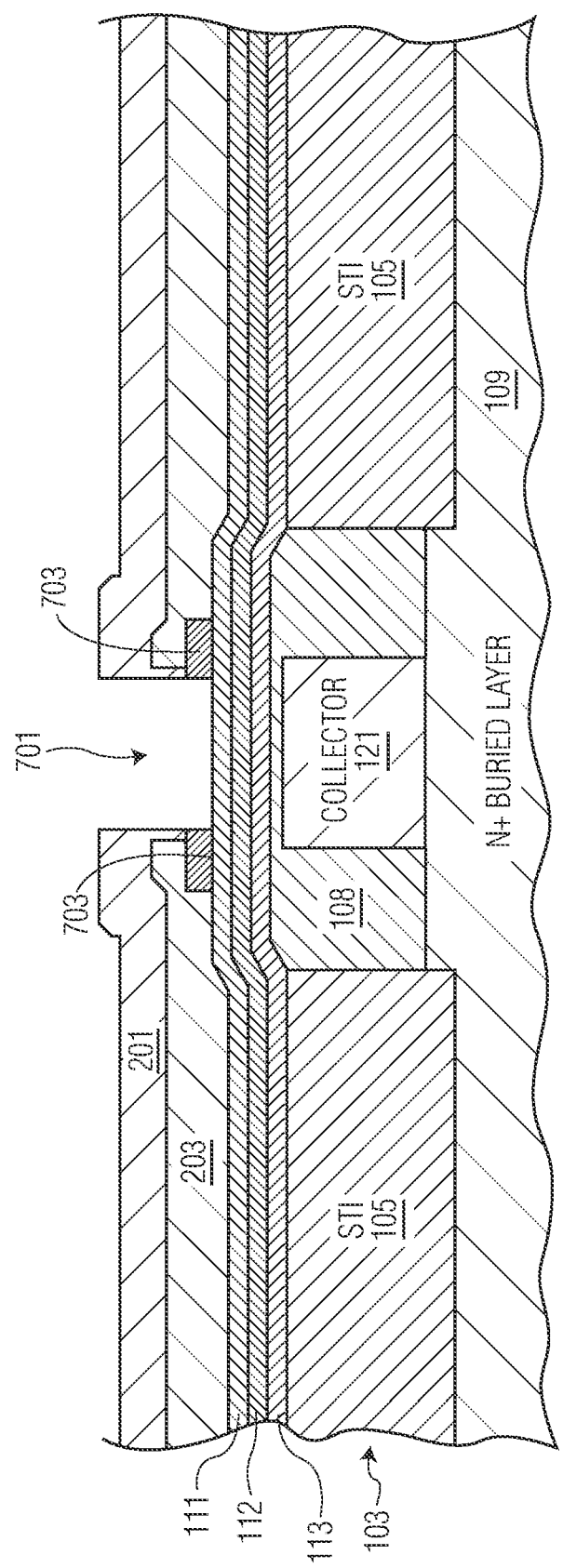

FIG. 7 is a partial cutaway side view of wafer 101 after the removal of a portion of layer 601 at a location directly over collector region 121 to form opening 701. A remaining portion 703 of layer 601 is left after the removal process. Remaining portion 703 is located directly under layer 203 and is in contact with both layer 203 and capping layer 111. In one embodiment, the portion of layer 601 is removed with an anisotropic etch (e.g., a reactive ion etch) with an etching process that removes the silicon germanium of layer 601 and is selective to the nitride of layer 201 and spacer 401 and to the silicon of layer 111. In other embodiments, a downstream plasma of $CF_4$ mixed with $O_2$ may be used to remove a portion of layer 601. In still other embodiments, a combination of anisotropic and isotropic etch processes may be used.

In some embodiments, removal of a portion of conductivity doped semiconductor layer 601 may advantageously prevent conductivity dopants originating in layer 601 from diffusing into layer 111 and layer 112 at the location of the intrinsic base. Otherwise, diffusion of the conductivity dopants into the intrinsic base region may affect transistor performance in some embodiments.

Figure 8:
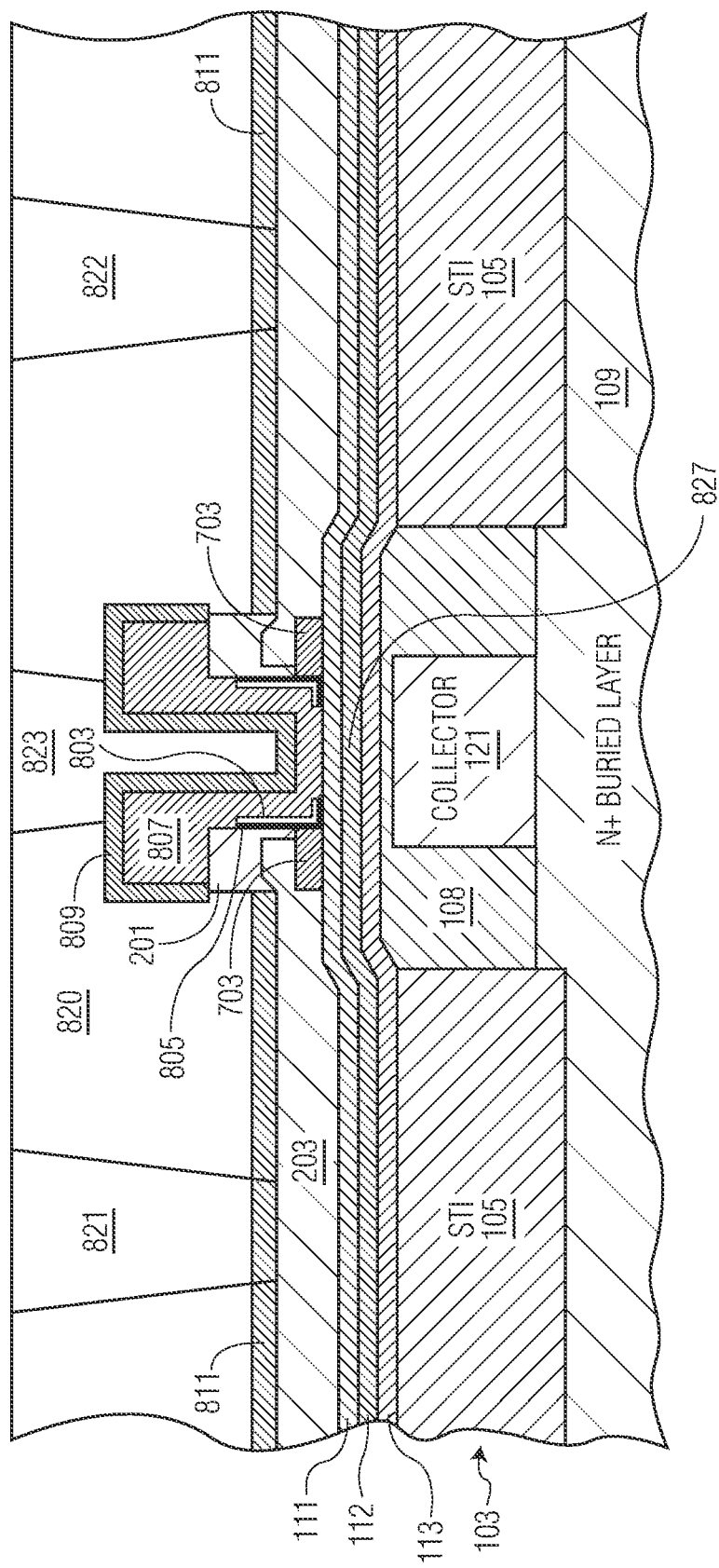

FIG. 8 is a partial cutaway side view of wafer 101 at a subsequent stage in its manufacture. After the removal of a portion of layer 601, an emitter window spacer of oxide spacer 805 and nitride spacer 803 are formed on the sidewalls of emitter opening 303 and the sidewalls of opening 701. In the cross-sectional view of FIG. 8, the emitter window spacer of oxide spacer 805 and nitride spacer 803 is shown as two separate portions. However, for the embodiment of FIG. 8, the spacer is contiguous around the entire perimeter of emitter window opening 303. The bottom of the emitter window spacer further narrows the emitter window to narrow the contact area between emitter electrode 807 and cap layer 111 to define the lateral area of the intrinsic base 827 of the transistor in layer 112. Generally, an intrinsic base is the portion of the base of a transistor through which the collector-emitter current flows.

In one embodiment, the emitter window spacer is formed by forming an initial thin oxide layer (of spacer 805), followed by forming a thin nitride layer (of spacer 803), and followed by forming a subsequent thin oxide layer (not shown). Afterwards, a poly silicon spacer (not shown) is formed to define the width of the bottom opening of the emitter window spacer. The oxide-nitride-oxide layers are etched using the poly silicon spacer as a mask. The subsequent oxide layer is anisotropically etched to form an oxide spacer (not shown) that is then used to anisotropically etch the thin nitride layer to form spacer 803, which is then used to etch (isotropically, anisotropically, or by a combination of the two) the initial thin oxide layer to form spacer 805. The oxide spacer of the subsequent oxide layer is removed during subsequent processing (e.g., during an HF acid clean before emitter material deposition), although it may remain in some embodiments. In other embodiments, an emitter window spacer may be formed by other processes and/or be made of other materials. Some embodiments may not include an emitter window spacer.

After the formation of the emitter window spacer, an emitter electrode is formed. In one embodiment, a poly silicon layer is deposited on wafer by a non selective epitaxial process. In one embodiment, the polysilicon layer is doped with an N-type dopants at a concentration of 1e21 per cm3, but may be doped at other concentrations in other embodiments. The polysilicon layer and underlying nitride layer 201 are then patterned to form emitter electrode 807 which includes a remaining portion of nitride layer 201 located directly underneath electrode 807. The etching of the nitride layer exposes portions of base electrode layer 203 as shown in FIG. 8. In one embodiment, these layers are patterned through a patterned photoresist mask (not shown) using a reactive ion etch (RIE).

After the formation of emitter electrode 807, base silicide structure 811 and emitter silicide structure 809 are formed on base layer 203 and emitter electrode 807, respectively. In one embodiment of forming silicide structures 811 and 809, a layer of cobalt (not shown) is deposited on the exposed surfaces of wafer 101. In one embodiment, the cobalt is deposited using a chemical vapor deposition (CVD) process. However, in other embodiments, other metals used for silicidation (e.g., tungsten, platinum, nickel) may be deposited. Wafer 101 is then subject to an anneal where the deposited cobalt is reacted with any exposed semiconductor material that includes silicon to form a layer of cobalt silicide (e.g., structures 811, 809) on those surfaces. The unreacted cobalt is then removed.

After the formation of silicide structures 811 and 809, one of more layers of dielectric material 820 are formed on wafer 101. Openings are then formed in material 820 to expose the silicide structures (e.g., silicide structures 811 and 809). Contact metal (e.g., tungsten, titanium, and/or titanium nitride) is then formed in the openings where wafer 101 is planarized to form the contacts for the electrodes of wafer 101. For example, base contacts 821 and 822 are formed to contact base silicide structure 811 and emitter contact 823 is formed to contact emitter silicide structure 809.

Accordingly, FIG. 8 shows a cross section of a HBT bipolar transistor with an emitter that includes an intrinsic emitter portion of N-type doped silicon directly contacting layer 111. The bipolar transistor includes a base including a P-type doped intrinsic base 827 in a monocrystalline portion of SiGe base layer 112 that is located directly under the portion of emitter electrode 807 that is in contact with layer 111. The base of the transistor also includes heavily doped $N_+$ portion 703 and base electrode poly silicon layer 203. The transistor also includes a collector including region 121 located in collector well 108. The contact for the collector is not shown in FIG. 8.

As shown in FIG. 8, base contacts 821 and 822 electrically contact base silicide structure 811. Base silicide structure 811 contacts base electrode layer 203 (which is doped with P-type dopants in some embodiments) which is in contact with heavily P-type doped portion 703. During relatively high temperature processes such as during the formation of nitride spacer 803 and silicide structures 811 and 809 as well as during a final anneal process, P-type dopants from portion 703 diffuse downward through cap layer 111 to SiGe layer 112 thereby creating a conductive path from portion 703 through cap layer 111 to SiGe layer 112. Accordingly, a conductive path exists from contacts 821 and 822, through silicide structure 811, through layer 203, through heavily doped portion 703, through the diffused doped portion of cap layer 111, through portions of SiGe layer 112 outside of the intrinsic base, to the intrinsic base 827 of layer 112. Because the location of heavily doped portion 703 is adjacent to the emitter window and is in contact with both link layer 203 and cap layer 111, portion 703 provides for a low resistance path from electrode layer 203 to layer 111 which lowers the resistance of the conductive path from base contacts 821 and 822 to the intrinsic base 827. In some embodiments, this lower resistance enables the transistor to be utilized in higher frequency applications (e.g., in the GHz range) such as e.g., in 5G and 6G cellular applications. Also, in some embodiments, alignment of the inner edge of portion 703 with the inside spacer 401 may provide for an optimally low resistance path for a given emitter opening 303 width. In some embodiments, dopants from portion 703 may at least partially diffuse through cap layer 111 during processes occurring prior to the stage of FIG. 8.

Also, during the high temperature processes, N-type dopants from electrode 807 diffuse into cap layer 111. N-type dopants from well 108 and SIC region 121 diffuse upward to layer 113 to create NPN junctions with the intrinsic base 827 in P-type doped SiGe layer 112.

After the stage of manufacture shown in FIG. 8, subsequent processes may be performed on wafer 101. For example, upper interconnect layers (not shown) may be formed on top of wafer 101 and include conductive structures electrically coupled to the contacts for the collector, emitter, and/or base of the transistor of FIG. 8 as well as to the contacts of other devices formed on wafer 101. Afterwards, wafer 101 is separated into multiple semiconductor dies, each with at least one transistor similar to the transistor shown in FIG. 8. The die are then implemented in semiconductor packages that can be utilized in electronic systems such as e.g., RF communications devices, motor controllers, automotive electronics systems, or cellular phones. In one example, the transistor is used as a power amplifier to amplify a received RF signal or to amplify an RF signal to be transmitted, for example, as used in a cellular telephone.

Figure 9:
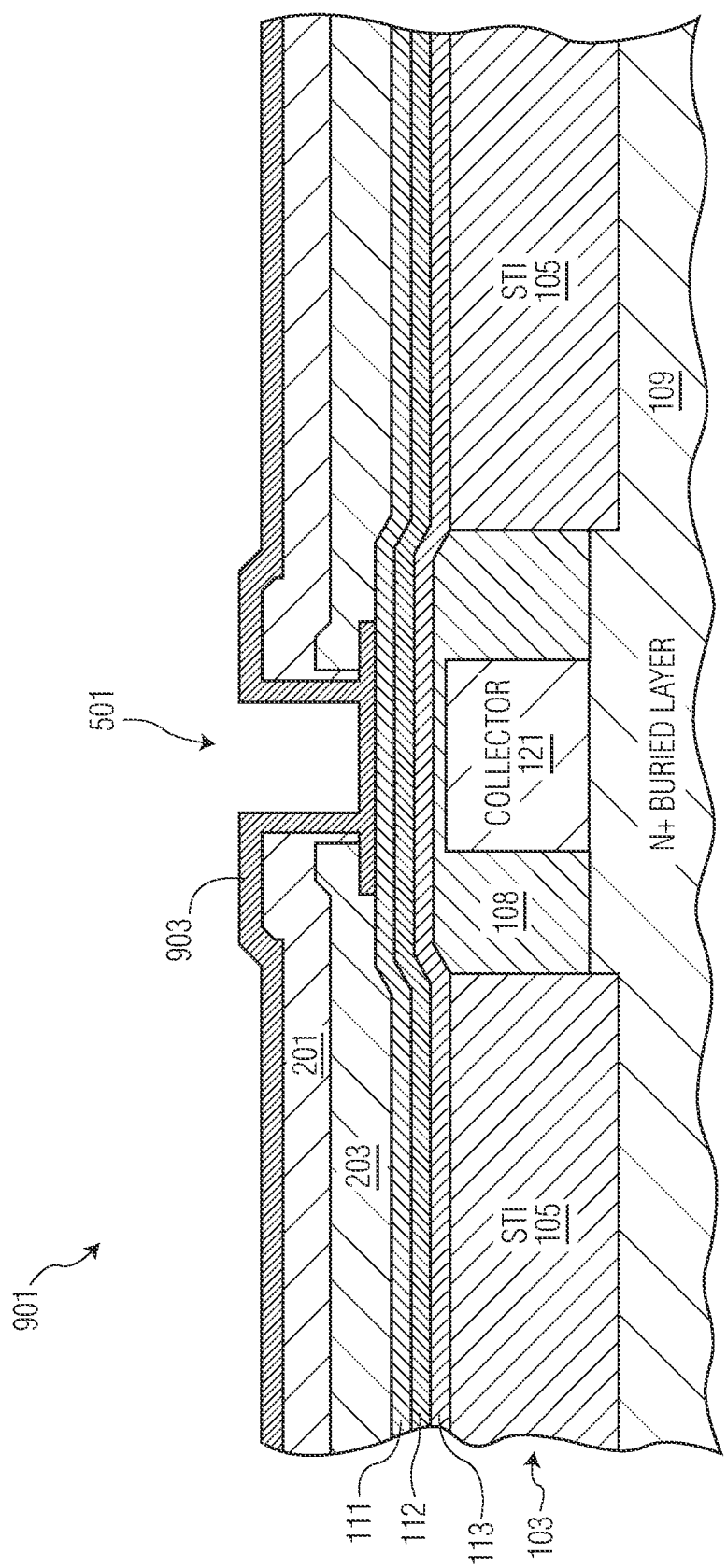
FIG. 9 is a partial cutaway side view of a wafer at a stage in the manufacture of a semiconductor device according to another embodiment of the present invention.

FIG. 9 is a cutaway side view of a wafer 901 during a stage in the manufacturer of a transistor according to another embodiment. The stage shown in FIG. 9 is an alternative embodiment to some of the processes of FIGS. 1-8, where structures having the same reference numbers are similar. FIG. 9 is an alternate stage to the stage of FIG. 6 where a doped SiGe layer 903 is grown on exposed surfaces of wafer 901 by a non selective deposition process. In the process, deposited material enters opening 501 through opening 303. In contrast, in the embodiment of FIG. 6, layer 601 is grown by using a selective deposition process. In a subsequent processes to the stage of FIG. 9, the portions of layer 903 not covered are removed by an isotropic etch or a combination of anisoptropic and isotropic etches such that wafer 901 resembles the stage of FIG. 7 with only portion 703 of layer 903 remaining.

Figure 10:
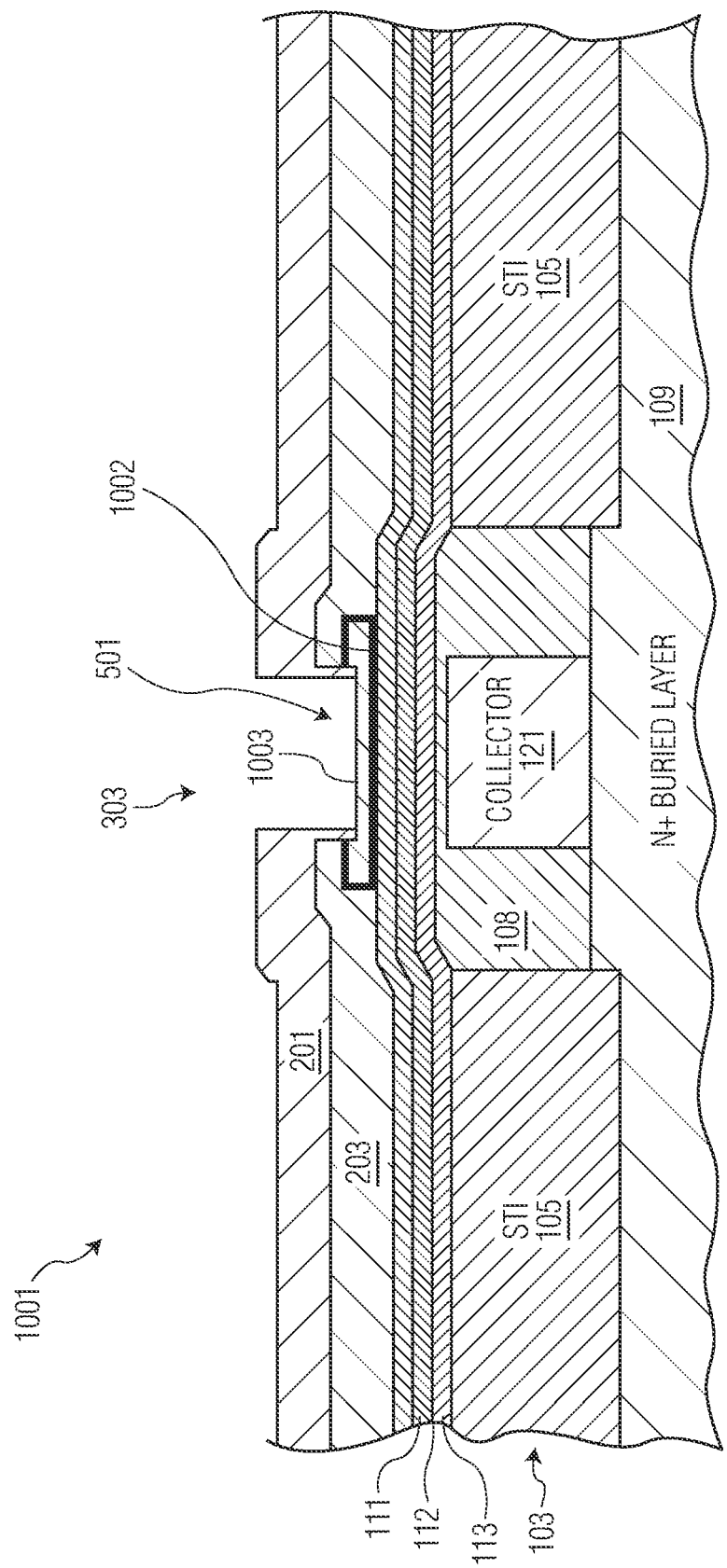
FIGS. 10-11 are partial cutaway side views of a wafer during various stages in the manufacture of a semiconductor device according to another embodiment of the present invention.
Figure 11:
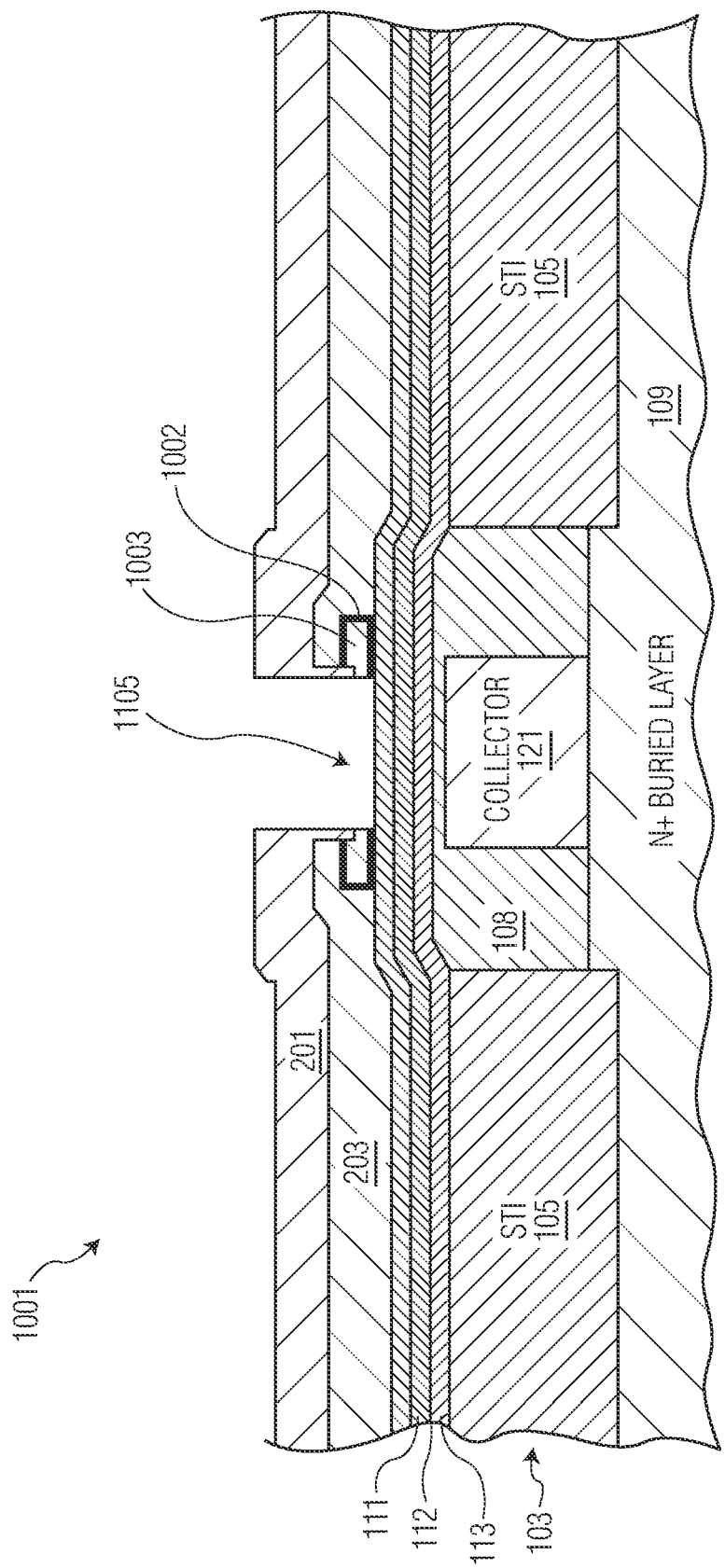

FIGS. 10 and 11 are partial cutaway side views of a wafer 1001 during various stages in the manufacture of a transistor according to another embodiment of the present invention. Structures with the same references numbers as with earlier described embodiments are similar.

FIG. 10 is a partial cutaway side view of wafer 1001 at a stage subsequent to the stage shown in FIG. 5. With the embodiment of FIGS. 10 and 11, a SiGe layer 1002 and silicon layer 1003 are formed in opening 501 (see FIG. 5) instead of the SiGe layer 601 of FIG. 6. In one embodiment, after cavity 501 is formed, in-situ P-type doped, SiGe layer 1002 is selectively formed on the exposed semiconductor surfaces of cavity 501. In one embodiment, layer 1002 is formed by a selective epitaxial deposition process where deposited material enters opening 501 through opening 303. In one embodiment, layer 1002 has a thickness in the range of 5-15 nm, but may have other thickness in other embodiments. Afterwards, heavily P-type doped silicon layer 1003 is formed on layer 1002 to fill the remaining portion of cavity 501. In one embodiment, layer 1003 is formed by a selective epitaxial deposition process wherein deposited material enters opening 501 through opening 303. In one embodiment, both layers 1002 and 1003 having a P-type conductivity doping concentration of 1e21 per cm3, but each may be of a different doping concentration in other embodiments.

FIG. 11 shows wafer 1001 after unprotected portions of layers 1003 and 1002 are removed to form opening 1105 that exposes layer 111. In one embodiment, silicon layer 1003 is first anisotropically etched with an etchant that is selective to nitride and silicon germanium. Then layer 1002 is anisotropically etched with an etchant that is selective to nitride and silicon to expose layer 111. The processes subsequent to the stage of FIG. 7 described earlier are then performed on wafer 1001. In some embodiments, the thin SiGe layer 1002 may enable more of the boron from layer 1003 to diffuse into layer 111, resulting in a lower base resistance.

FIGS. 12-16 are a partial cutaway side views of a wafer 1201 during stages in its manufacturer according to another embodiment. The stages of FIGS. 12-16 shows an alternative embodiment to the processes of FIGS. 1-8 where structures having the same references numbers as earlier embodiments are similar. In contrast to the embodiment of FIGS. 1-8, the layer that includes the intrinsic base (e.g., layer 1507 of FIG. 15), is not formed until after a portion of the heavily doped semiconductor layer (1303 of FIG. 13) is removed (See FIG. 14).

Figure 12:
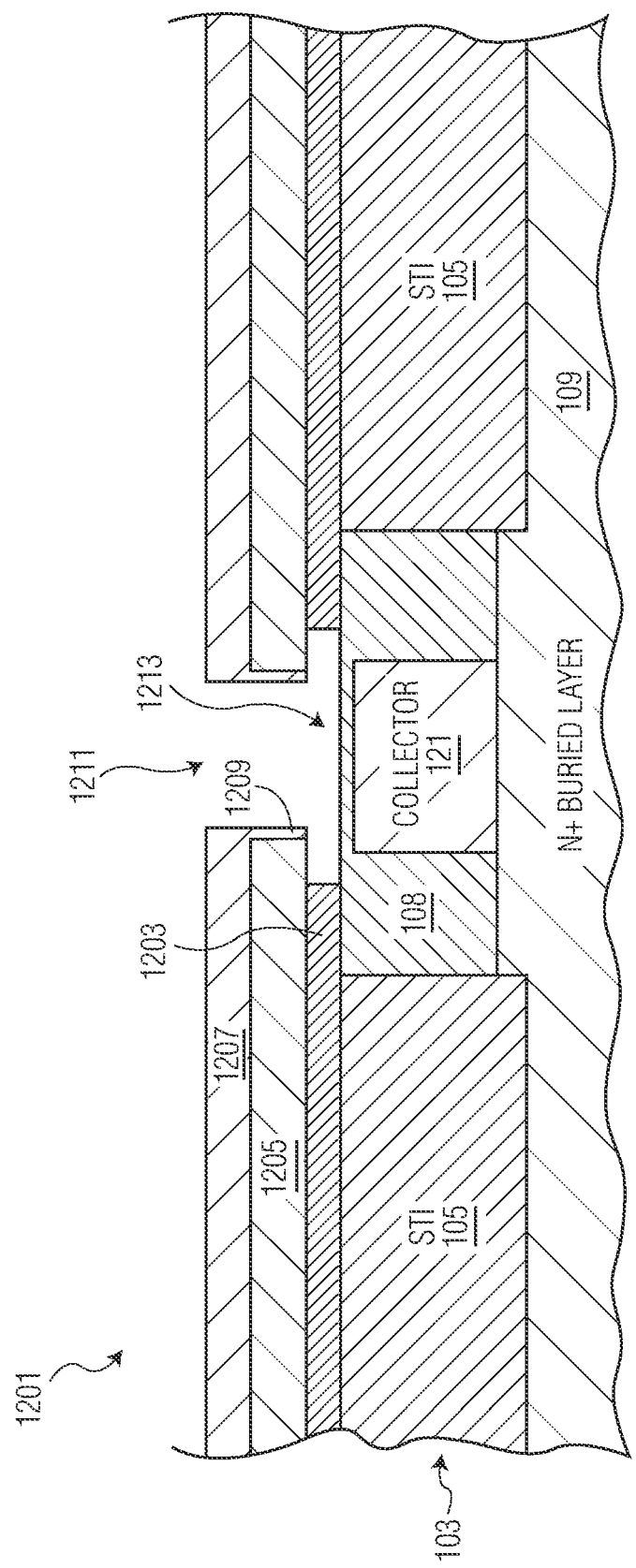
FIGS. 12-16 are partial cutaway side views of a wafer during various stages in the manufacture of a semiconductor device according to another embodiment of the present invention.

Referring to FIG. 12, an oxide layer 1203 is formed on substrate 103 including on STI 105 and well 108. In one embodiment, layer 1203 is formed by a TEOS process and has a thickness in the range of 40-70 nm, but maybe formed by other processes, be made of other materials, and/or have other thicknesses in other embodiments.

A blanket poly silicon layer 1205 is non selectively formed on layer 1203. Layer 1205 will serve as a base electrode layer for a subsequently formed transistor. In one embodiment, layer 1205 has a thickness of in the range of 30-120 nm but may have other thicknesses in other embodiments. In one embodiment, layer 1205 is doped with conductivity dopants (e.g., boron for an NPN transistor) at a concentration of 1e21 per cm3, but may be doped at other concentrations in other embodiments.

A blanket layer 1207 of nitride is formed on layer 1205. in one embodiment, layer 1207 has a thickness in the range of 30-100 nm, but may be of other thicknesses in other embodiments. In one embodiment, layer 1207 is formed by a deposition process with process temperatures reaching up above 700 C.

After the formation of nitride layer 1207, an emitter opening 1211 is formed in layers 1207 and 1205 to expose layer 1203. In one embodiment, opening 1211 is formed by a reactive ion etch (RIE) through an opening in a patterned photoresist mask (not shown). However, opening 1211 may be formed by other processes in other embodiments. In the embodiment shown, opening 1211 is formed in an area of wafer 101 that is located between STI 105 portions shown in FIG. 12.

After the formation of opening 1211, nitride spacers 1209, which are similar to nitride spacers 401 of FIG. 4, are formed on the exposed sidewalls of layer 1205 and layer 1207.

After the formation of opening 1211 to expose layer 1203, an opening 1213 is formed in layer 1203. In one embodiment, opening 1213 is formed by a timed isotropic etch with an etch chemistry that is selective to the silicon of well 108, the nitride of layer 1207 and spacer 1209, and the polysilicon of layer 1205. In some embodiments, opening 1213 may be formed by a combination of isotropic and anisotropic etches.

In one embodiment, the lateral area of opening 1213 is dependent upon the amount of area on the underside of layer 1205 that is to be in contact with a highly doped semiconductor layer. See FIG. 14 showing the width of the contact area of portion 1403 and layer 1205.

Figure 13:
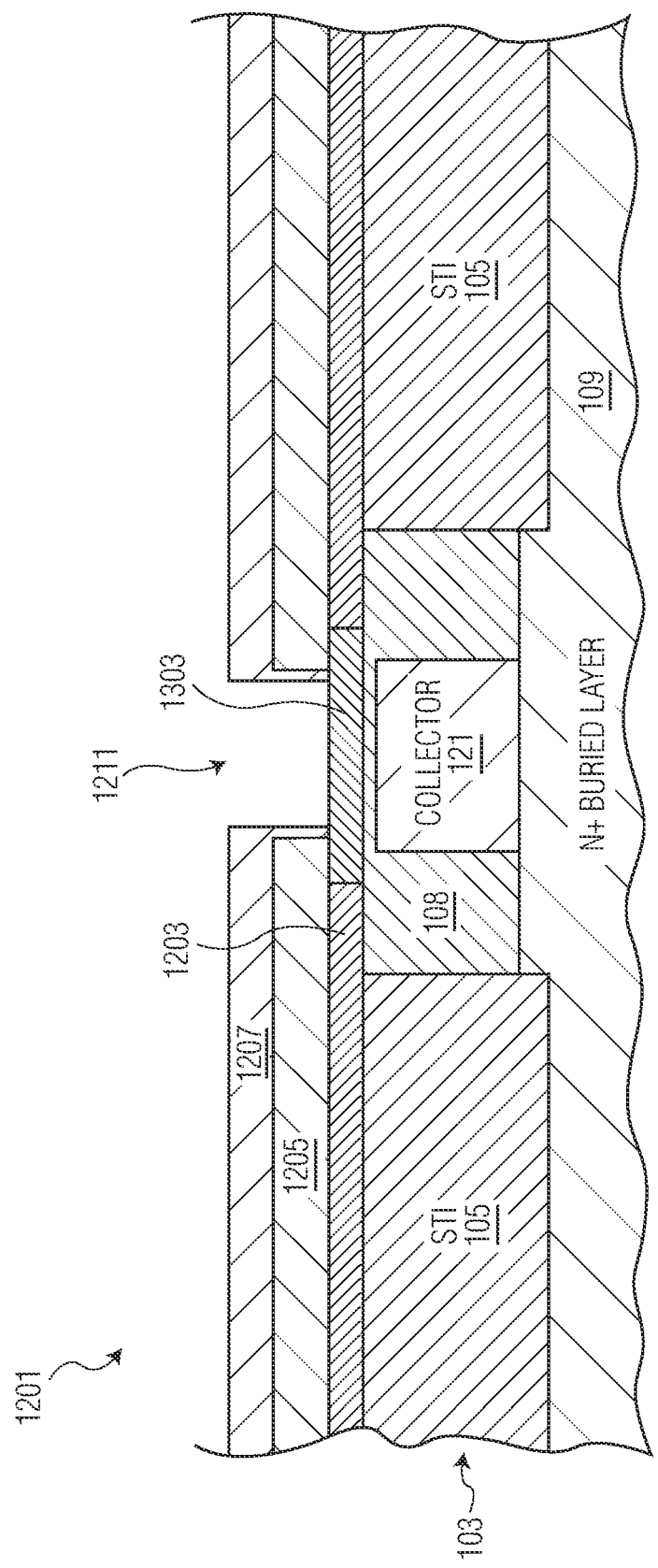

FIG. 13 is a partial cutaway side view of wafer 1201 after highly doped semiconductor layer 1303 is formed in the opening 1213 by a selective epitaxial deposition process. In one embodiment, layer 1303 is similar to SiGe layer 601 in FIG. 6. In other embodiments, layer 1303 may be similar to the combination of SiGe layer 1002 and silicon layer 1003 as shown in FIG. 10. In still other embodiments, a non selective SiGe layer similar to layer 903 in FIG. 9 maybe formed on wafer 1201.

Figure 14:
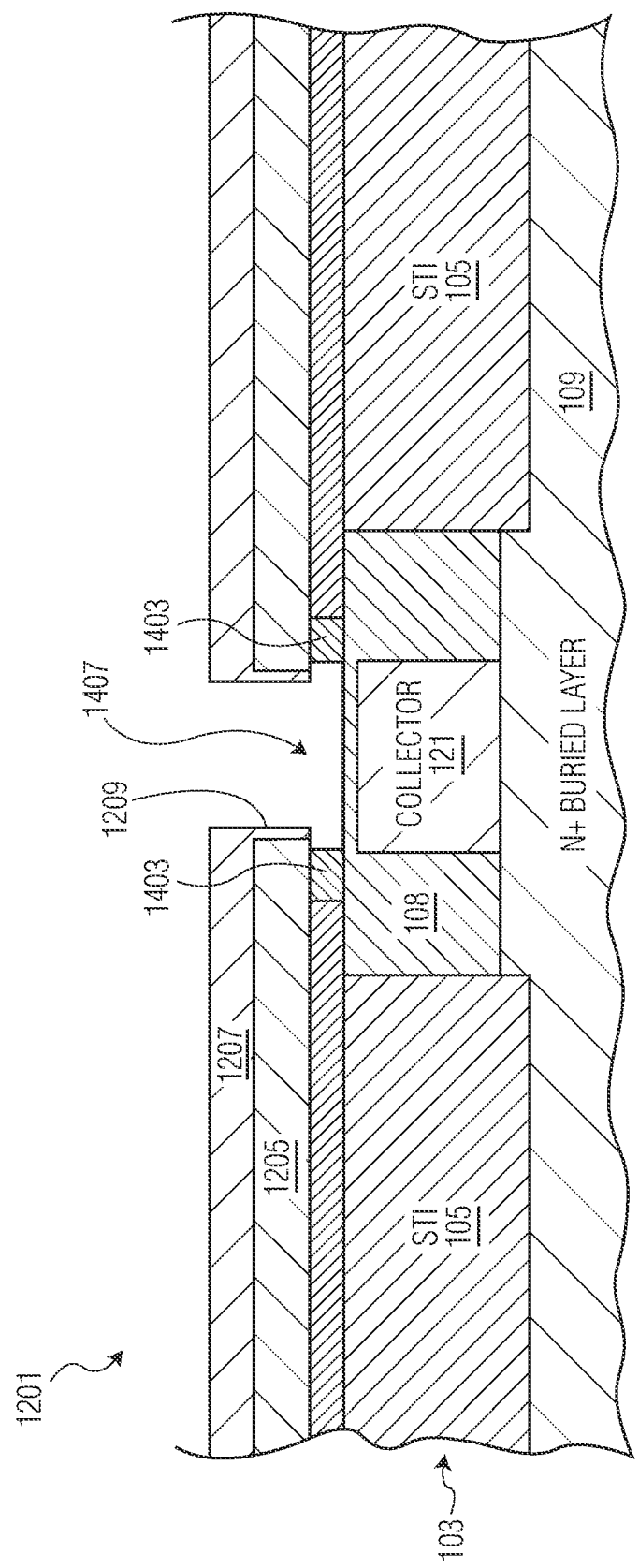

FIG. 14 is a partial cutaway side view of wafer 1201 after an opening 1407 is formed by removing a portion of layer 1303 to form remaining portion 1403. In one embodiment, opening 1407 is formed by an isotropic timed etch with an etch chemistry that is selective to nitride of layer 1207 and spacer 1209, to the polysilicon of layer 1205, and to monocrystalline silicon of well 108. In the embodiment shown, a portion of the underside of layer 1205 is exposed by the etching. In other embodiments, opening 1407 is formed by an anisotropic etch where the edges of the remaining portion 1403 align with the edges of the sidewalls of spacer 1209.

Figure 15:
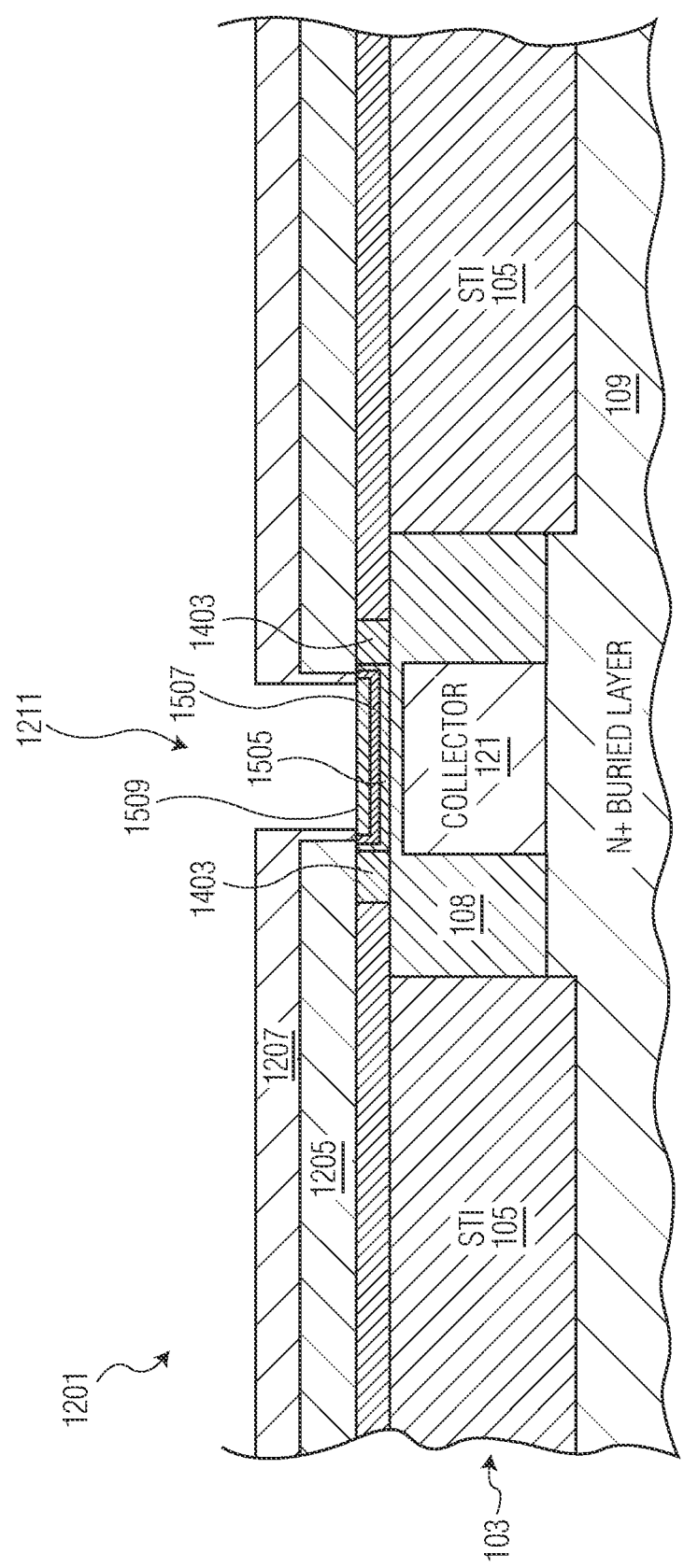

FIG. 15 is a partial cutaway side view of wafer 1401 after silicon layer 1505, silicon germanium layer 1507, and silicon cap layer 1509 are formed in opening 1407. Layer 1505 is grown by a selective epitaxial deposition process where silicon is deposited on exposed portions of layer 1205, portion 1403, and well 108. Silicon germanium layer 1507 is grown by a selective epitaxial deposition process on layer 1507. Silicon cap layer 1509 is formed by a selective epitaxial deposition process on layer 1507. In some embodiments, layer 1507 is doped with P-type dopants. Layer 1507 will include the intrinsic base of a subsequently formed transistor (see FIG. 16).

Figure 16:
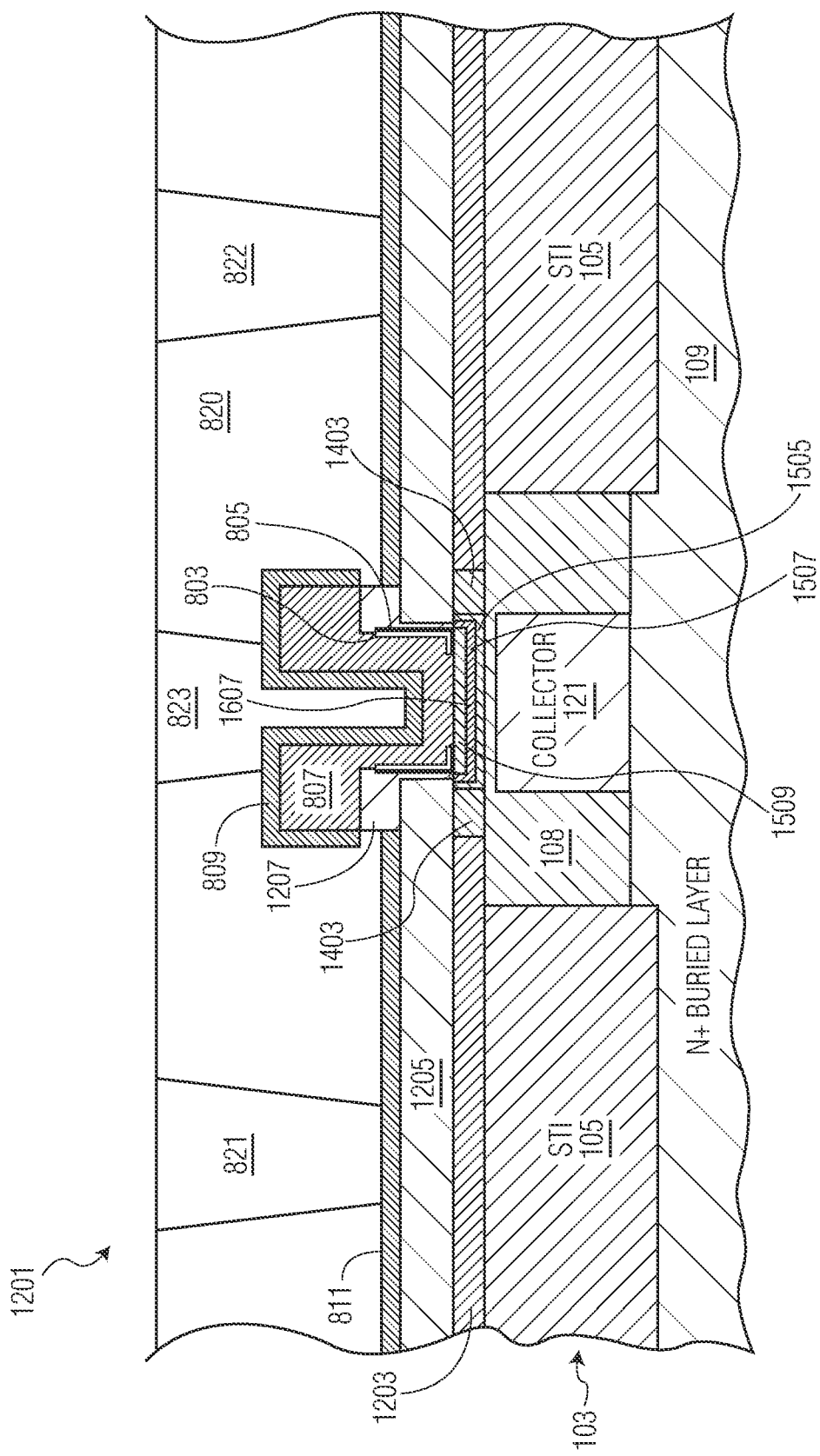

FIG. 16 is a partial cutaway side view of wafer 1201 after the formation of an emitter widow spacer (oxide spacer 805 and nitride spacer 803), emitter electrode 807, emitter silicide structure 809, base silicide structure 811, one or more dielectric material 820, base contacts 821 and 822, and emitter contact 823. See the discussion of FIG. 8 above regarding the formation of these structures. Afterwards, further structures maybe formed on wafer 1201 (see the discussion above regarding further processes after the stage of FIG. 8).

FIG. 16 shows a cross section of a HBT bipolar transistor with an emitter electrode 807 that includes an intrinsic emitter portion of N-type doped silicon directly contacting layer 1509. The bipolar transistor includes a base including a P-type doped intrinsic base 1607 in SiGe base layer 1507 that is located directly under the portion of emitter electrode 807 that is in contact with layer 1509. The base of the transistor also includes heavily doped $N_+$ portion 1403 and base electrode layer poly silicon layer 1205. The transistor also includes a collector including region 121 located in collector well 108. The contact for the collector is not shown in FIG. 16.

As shown in FIG. 16, base contacts 821 and 822 electrically contact base silicide structure 811. Base silicide structure 811 contacts base electrode layer 1205 (which is doped with P-type dopants in some embodiments), which is in contact with heavily P-type doped portion 1403. During relatively high temperature processes such as final anneal, the formation of nitride spacers, and the formation of silicide structures 811 and 809, P-type dopants from portion 1403 diffuse laterally through layer 1505 to SiGe layer 1507 creating a conductive path from portion 1403 to layer 1507. Accordingly, a conductive path exists from base contacts 821 and 822, through silicide structure 811, through layer 1205, through heavily doped portion 1403, through the diffused doped portion of layer 1505 to the intrinsic base 1607 of layer 1507. Because the heavily doped portion 1403 is adjacent to the area of the emitter window and is in contact with both electrode layer 1205 and layer 1505, portion 1403 provides for a low resistance path from electrode layer 1205 to layer 1505, which lowers the resistance of the conductive path from base contacts 821 to the intrinsic base 1607. In some embodiments, the dopants from portion 1403 may at least partially diffuse through layer 1505 during processes prior to the stage of FIG. 16.

Also, during the high temperature processes, N-type dopants from electrode 807 diffuse into cap layer 1509. N-type dopants from well 108 and SIC region 121 diffuse upward to layer 1505 to create NPN junctions with the intrinsic base 1607 of P-type doped SiGe layer 1507.

With the embodiment of FIG. 16, the material of the intrinsic base (layer 1507) is formed after the removal of a portion of SiGe layer 1303, whereas with the embodiment of FIG. 8, the material of the intrinsic base (layer 112) is formed before the formation of SiGe layer 601. In one embodiment, forming the material of the intrinsic base after the removal of the heavily doped semiconductor base layer (layer 1303) may provide for a process of forming layers of the intrinsic base that are not damaged by the removal of the heavily doped semiconductor layer.

As shown herein, providing processes that form a heavily doped semiconductor layer after forming the emitter window and that remove portions of the heavily doped semiconductor layer may provide for a transistor with a lower conductivity path from a base link layer to an intrinsic base, thereby allowing the transistor to operate at higher frequencies. Furthermore, such a process may provide for a more accurate placement of base linking conductivity dopants from the remaining portions of the heavily doped semiconductor layer, thereby providing a lower conductivity path while minimizing the effect of those dopants on other transistor structures such as the intrinsic base.

In the embodiments shown above, the heavily doped semiconductor layers 601, 903, 1002, and 1303 are made of boron doped SiGe. In some embodiments, using SiGe for these layers may provide for a material with a good etch selectability with respect to silicon and provide a layer with high conductivity as an extrinsic base link region. Furthermore, for those embodiments that use SiGe for other layers (e.g., layer 112), the tools for SiGe deposition would already be readily available. However, other types of materials may be used for these heavily doped semiconductor layers in other embodiments. For example, in some embodiments where an NPN transistor is being formed, these heavily doped semiconductor layers could be made of silicon doped with both gallium and boron. The gallium doping would provide the silicon layer with etch selectivity from other silicon layers (e.g., silicon layers 111, 203, 1205) and would have a lower mobility such that is would not diffuse easily into other layers. For embodiments where a PNP transistor is being formed, silicon doped with phosphorous (or arsenic) and antimony may be used where the antimony would provide the silicon with etch selectability from other silicon layers (111, 203, and 1205) and the phosphorous (or arsenic) would provide for a conductivity dopant with higher mobility for diffusion into layers 111 and 1505.

The transistors described herein may have other configurations, have other structures, be made of other materials, and/or may be made by other processes. For example, although the embodiment of FIG. 8 shows remaining portion 703 contiguously surrounding electrode 807, in other embodiments, portion 703 may partially surround or be located on only one side of emitter electrode 807. In still other embodiments, remaining portions of layer 601 may not be contiguously connected around emitter electrode 807. In some embodiments, layer 203 may be planarized to be coplanar with the top surface of pad 119 prior to forming layer 201. Also, although the embodiments of FIGS. 1-16 describe processes where NPN transistors are being formed, in other embodiments, similar processes may be utilized for forming PNP transistors where the doping conductivity types for the structures described for the NPN transistors would be switched.

In one embodiment, a method for forming a transistor includes forming a collector of a transistor, forming an intrinsic base of the transistor, forming a first layer over a substrate, forming a first opening the in the first layer, and forming a first semiconductor layer doped with a conductivity dopant after the forming the first opening. The forming the first semiconductor layer includes depositing semiconductor material on surfaces through the first opening by a material deposition process after forming the first opening. The method includes removing a first portion of the first semiconductor layer after forming the first semiconductor layer. At least a second portion of the first semiconductor layer remains after the removing. The method includes forming an emitter electrode after the removing the first portion. The emitter electrode includes at least a portion located in the first opening. The second portion of the first semiconductor layer is in a conductive path to the intrinsic base of the transistor.

In another embodiment, a method for forming a transistor includes forming a collector of a transistor in a substrate, forming an intrinsic base of the transistor, forming a first layer over the substrate, forming a first opening the in the first layer, and forming a SiGe layer doped with a conductivity dopant after the forming the first opening. The forming the SiGe layer includes epitaxially depositing semiconductor material on surfaces through the first opening by a material deposition process after forming the first opening. The method includes removing a first portion of the SiGe layer after forming the SiGe layer. At least a second portion of the SiGe layer remains after the removing. The method includes forming an emitter electrode after the removing the first portion. The emitter electrode includes at least a portion located in the first opening. The second portion of the SiGe layer is in a conductive path to the intrinsic base of the transistor.

As disclosed herein, a first structure is "directly over" a second structure if the first structure is located over the second structure in a line having a direction that is perpendicular with a generally planar major side of the wafer or substrate. For example, in FIG. 8, silicide structure 809 is directly over portion 703. Contact 822 is not directly over portion 703. As disclosed herein, a first structure is "directly beneath" or "directly under" a second structure if the first structure is located beneath the second structure in a line having a direction that is perpendicular with a generally planar major side of the wafer or substrate. For example, in FIG. 8, portion 703 is directly beneath silicide structure 809. Portion 703 is not directly beneath contact 821. One structure is "directly between" two other structures in a line if the two structures are located on opposite sides of the one structure in the line. For example, in FIG. 8, the remaining portion of nitride layer 201 is located directly between contacts 821 and 822 in a line in the cut away side view of FIG. 8. Collector region 121 is not located directly between contacts 821 and 822. A first structure is "directly lateral" to a second structure if the first structure and second structure are located in a line having a direction that is parallel with a generally planar major side of the wafer or substrate. For example, emitter contact 823 and base contact 822 are directly lateral to each other. One structure is "directly laterally between" two other structures if the two structures are located on opposite sides of the one structure in a line that is parallel with a generally planar major side of the wafer or substrate. For example, in FIG. 8, nitride layer 201 is located directly laterally between base contact 821 and base contact 822. A surface is at a "higher elevation" than another surface, if that surface is located closer to the top of the active side of a wafer or die in a line having a direction that is perpendicular with the generally planar major side of the wafer or die. In the views of FIGS. 1-16, the active side of the wafer is the top side of the Figures. For example, silicide stricture 809 is at a higher elevation than portion 703.

Features specifically shown or described with respect to one embodiment set forth herein may be implemented in other embodiments set forth herein.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a transistor, the method comprising:
   forming a collector of the transistor;
   forming an intrinsic base of the transistor;
   forming a first layer over a substrate;
   forming a first opening in the first layer;
   forming a first semiconductor layer doped with a conductivity dopant after forming the first opening, wherein forming the first semiconductor layer includes depositing semiconductor material on surfaces through the first opening by a material deposition process after forming the first opening, and wherein the first semiconductor layer is characterized as a silicon germanium layer;

removing a first portion of the first semiconductor layer after forming the first semiconductor layer, wherein at least a second portion of the first semiconductor layer remains after removing the first portion; and forming an emitter electrode after removing the first portion, wherein the emitter electrode includes at least a portion located in the first opening, and wherein the second portion of the first semiconductor layer is in a conductive path to the intrinsic base of the transistor.

2. The method of claim 1, wherein the first portion of the first semiconductor layer is located directly over the intrinsic base of the transistor.

3. The method of claim 1, wherein removing the first portion forms a second opening, wherein forming the intrinsic base includes forming at least a portion of the intrinsic base in the second opening after removing the first portion.

4. The method of claim 1, further comprising:
forming a base silicide structure, wherein the second portion of the first semiconductor layer is in a conductive path between the intrinsic base and the base silicide structure.

5. A method for forming a transistor, the method comprising:
forming a collector of the transistor;
forming an intrinsic base of the transistor;
forming a first layer over a substrate, wherein the first layer is characterized as a semiconductor layer;
forming a first opening in the first layer;
forming a first semiconductor layer doped with a conductivity dopant after forming the first opening, wherein forming the first semiconductor layer includes depositing semiconductor material on surfaces through the first opening by a material deposition process after forming the first opening;
removing a first portion of the first semiconductor layer after forming the first semiconductor layer, wherein at least a second portion of the first semiconductor layer remains after removing the first portion, and wherein at least a portion of the second portion is contacting an underside surface of the first layer; and
forming an emitter electrode after removing the first portion, wherein the emitter electrode includes at least a portion located in the first opening, and
wherein the second portion of the first semiconductor layer is in a conductive path to the intrinsic base of the transistor.

6. The method of claim 5, wherein removing the first portion of the first semiconductor layer includes utilizing an etching process that is selective to a material of the first layer.

7. The method of claim 1, wherein the intrinsic base is located in a silicon germanium layer, a silicon layer is formed on the silicon germanium layer, wherein the first semiconductor layer is formed on the silicon layer.

8. The method of claim 1, wherein the first semiconductor layer is formed on a silicon monocrystalline portion of the substrate.

9. The method of claim 1, further comprising:
forming a second layer over the substrate prior to forming the first layer;
removing at least a portion of the second layer through the first opening, wherein at least a portion of the first semiconductor layer is formed at a location where at least a portion of the second layer was removed.

10. The method of claim 9, wherein a first portion of the at least the portion of the second layer is located directly below the first opening in the first layer, and a second portion of the at least the portion of the second layer is located directly below the first layer lateral to the first opening, and wherein at least a portion of the second portion of the first semiconductor layer is located directly underneath the first layer lateral to the first opening.

11. The method of claim 9, wherein the second layer is patterned prior to forming the first layer.

12. The method of claim 9, wherein removing the at least the portion of the second layer through the first opening forms a second opening, and wherein forming the first semiconductor layer includes forming the first semiconductor layer on exposed surfaces of the second opening.

13. The method of claim 12, further comprising:
forming a silicon layer on the first semiconductor layer, including forming the silicon layer in portions of the second opening.

14. The method of claim 1, wherein:
the first layer is a dielectric layer.

15. The method of claim 14, wherein the first layer includes nitride.

16. The method of claim 1, wherein the first layer is characterized as a semiconductor layer, and wherein the second portion is in a conductive base path between the intrinsic base and the first layer.

17. The method of claim 1, wherein the collector is formed in the substrate.

18. A method for forming a transistor, the method comprising:
forming a collector of the transistor in a substrate;
forming an intrinsic base of the transistor;
forming a first layer over the substrate;
forming a first opening in the first layer;
forming a silicon germanium (SiGe) layer doped with a conductivity dopant after the forming the first opening, wherein forming the SiGe layer includes epitaxially depositing semiconductor material on surfaces through the first opening by a material deposition process after forming the first opening;
removing a first portion of the SiGe layer after forming the SiGe layer, wherein at least a second portion of the SiGe layer remains after removing the first portion of the SiGe layer; and
forming an emitter electrode after removing the first portion of the SiGe layer, wherein the emitter electrode includes at least a portion located in the first opening, and
wherein the second portion of the SiGe layer is in a conductive path to the intrinsic base of the transistor.

19. The method of claim 18, further comprising:
forming a second layer over the substrate prior to forming the first layer; and
removing at least a portion of the second layer through the first opening, wherein at least a portion of the SiGe layer is formed at a location where the at least the portion of the second layer was removed.

* * * * *